US008069490B2

(12) United States Patent
Gross et al.

(10) Patent No.: US 8,069,490 B2
(45) Date of Patent: Nov. 29, 2011

(54) DETECTING COUNTERFEIT ELECTRONIC COMPONENTS USING EMI TELEMETRIC FINGERPRINTS

(75) Inventors: Kenny C. Gross, San Diego, CA (US); Ramakrishna C. Dhanekula, San Diego, CA (US); Andrew J. Lewis, Litchfield, NH (US)

(73) Assignee: Oracle America, Inc., Redwood Shores, CA (US)

( * ) Notice: Subject to any disclaimer, the term of this patent is extended or adjusted under 35 U.S.C. 154(b) by 1062 days.

(21) Appl. No.: 11/974,788

(22) Filed: Oct. 16, 2007

(65) Prior Publication Data

US 2009/0099830 A1  Apr. 16, 2009

(51) Int. Cl.
*G08B 29/00* (2006.01)
(52) U.S. Cl. ........................................................ 726/34
(58) Field of Classification Search .................... 726/34
See application file for complete search history.

(56) References Cited

U.S. PATENT DOCUMENTS

| 5,218,294 | A | 6/1993 | Soiferman |  |
|---|---|---|---|---|
| 7,250,757 | B1 | 7/2007 | Tiernan |  |
| 7,613,580 | B2 * | 11/2009 | Gross et al. | 702/89 |
| 2004/0075453 | A1 | 4/2004 | Slupsky |  |

OTHER PUBLICATIONS

Wu, Wei et al., "Continuous Wavelet Transform Application in Electromagnetic Compatability—Algorithms and Software Realization", University of Missouri-Rolla, EMC Consortium.

D'Amore, M. et al., "A Neutral Network Approach for Identification of EM Field Sources: Analysis of PCB Configurations", pp. 664-669, Dept. of Electrical Engineering, University of Rome "La Sapienza", 0-7803-5015-4/98.
Dong, Xiaopeng et al., "Detection and Identification of Vehicles Based on Their Unintended Electromagnetic Emissions", IEEE Transactions on Electromagnetic Compatibility. vol. 48, No. 4, Nov. 2006.
Gribok, Andrei V. et al., "Use of Kernel Based Techniques for Sensor Validation in Nuclear Power Plants", XP008098438, International Topical Meeting on Nuclear Plant Instrumentation, Controls, and Human-Machine Interface Technologies, Washington DC, Nov. 2000.
Salamati, Mahnaz et al., "Electromagnetic Signatures as a Tool for Connectionless Test", pp. 26-30, Board-Level Test Technologies, IEEE Design & Test of Computers.

* cited by examiner

*Primary Examiner* — Benjamin Lanier
*Assistant Examiner* — Devin Almeida
(74) *Attorney, Agent, or Firm* — Park, Vaughan, Fleming & Dowler LLP

(57) ABSTRACT

One embodiment of the present invention provides a system that non-intrusively detects counterfeit components in a target computer system. During operation, the system collects target electromagnetic interference (EMI) signals generated by the target computer system using one or more antennas positioned in close proximity to the target computer system. The system then generates a target EMI fingerprint for the target computer system from the target EMI signals. Next, the system compares the target EMI fingerprint against a reference EMI fingerprint to determine whether the target computer system contains a counterfeit component.

21 Claims, 11 Drawing Sheets

(4 of 11 Drawing Sheet(s) Filed in Color)

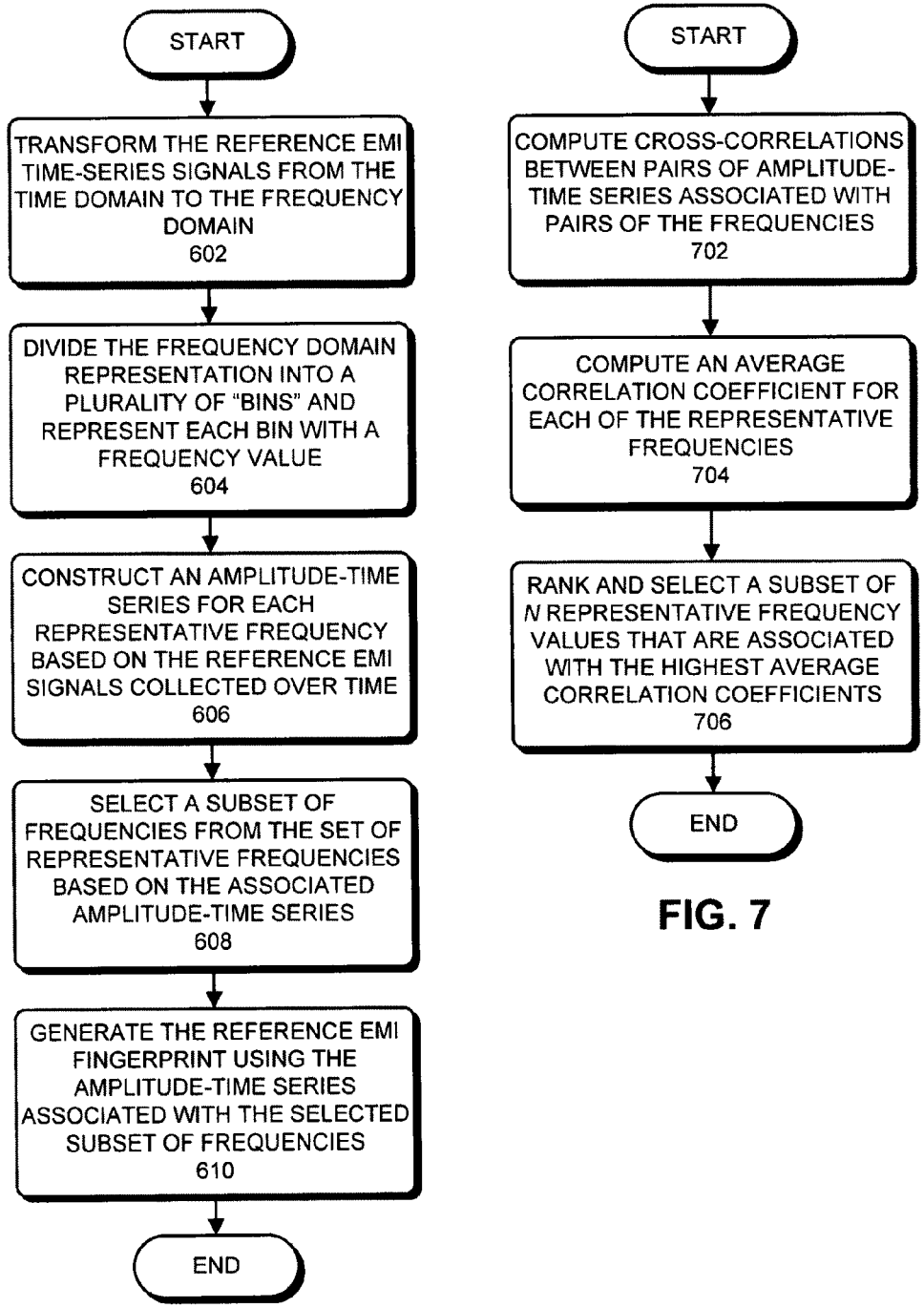

DETECTING COUNTERFEIT ELECTRONIC COMPONENTS USING EMI TELEMETRIC FINGERPRINTS

BACKGROUND

1. Field of the Invention

Embodiments of the present invention generally relate to techniques for detecting counterfeit components in electronic systems. More specifically, embodiments of the present invention relate to a method and an apparatus that detects counterfeit electronic components by monitoring and analyzing EMI emissions generated from an electronic system which contains the components.

2. Related Art

Counterfeiting of electronic components has become an increasing problem for electronics and computer system manufacturers worldwide. One expert on counterfeiting accurately summarizes the problem as follows: "counterfeit electronics have been reported in a wide range of products, including computers, telecommunications equipment, automobiles, avionics and military systems. Counterfeit electronic products include everything from very inexpensive capacitors and resistors to costly microprocessors. Unfortunately, this problem is growing rapidly and no signs of abatement are in sight." It has been estimated that counterfeiting of electronic components is costing the electronics industry $200 billion per year across the industry. One study estimated that as high as one in 10 information technology products is counterfeit.

In practice, counterfeiters typically use packaging, labeling, and part numbers that very closely match the authentic parts or systems to deceive purchasers. In fact, counterfeit parts often appear so real that service engineers cannot distinguish them from authentic parts by simply visually inspecting the parts. However, the counterfeit parts often contain scrap components from discarded systems, cheaply manufactured components, or older components from recycled vintage systems, which are repackaged to resemble authentic systems. Such systems are then integrated into the supply chain via brokerage channels. When the counterfeit parts or systems are shipped to customers, they often fail on arrival or within a very short time period. Counterfeit parts that have poor performance (e.g., systems with older versions of chips put into newer server boxes) can cause additional customer dissatisfaction. Furthermore, for military, medical, and aviation electronics, counterfeit parts and systems can lead to life-threatening problems.

The most commonly used technique for mitigating counterfeiting in the electronics and computing industry is to use technologies that make the labeling of parts very difficult for counterfeiters to reproduce (e.g., by using holographic labeling). However, the process of authenticating such state-of-the-art labels often requires a system or component to be disassembled. It also requires a person with a trained eye to examine internal parts to make subjective judgments on how well the colors and patterns in the labels match the authentic labels. Unfortunately, such intrusive counterfeit detection techniques are extremely labor-intensive, and are hence impractical for customs inspections. Furthermore, the detection techniques are prone to human errors because complex systems need to be disassembled and reassembled.

Hence, what is needed is a method and an apparatus that facilitates non-intrusive detection of counterfeit components in electronic systems without the above-described issues.

SUMMARY

One embodiment of the present invention provides a system that non-intrusively detects counterfeit components in a target computer system. During operation, the system collects target electromagnetic interference (EMI) signals generated by the target computer system using one or more antennas positioned in close proximity to the target computer system. The system then generates a target EMI fingerprint for the target computer system from the target EMI signals. Next, the system compares the target EMI fingerprint against a reference EMI fingerprint to determine whether the target computer system contains a counterfeit component.

In a variation on this embodiment, prior to collecting the target EMI signals, the system generates the reference EMI fingerprint by: collecting reference EMI signals generated by a certified authentic reference computer system of the same type as the target computer system and generating the reference EMI fingerprint for the certified authentic reference computer system from the collected reference EMI signals.

In a further variation on this embodiment, the reference EMI signals are generated by the certified authentic reference computer system during execution of a load script, wherein the load script includes a specified sequence of operations. Furthermore, the target EMI signals are generated by the target computer system during execution of the same load script.

In a further variation, the system generates the reference EMI fingerprint by: transforming the reference EMI signals from a time-domain representation to a frequency-domain representation, which is comprised of a plurality of discrete frequencies; for each of the plurality of discrete frequencies, constructing an amplitude-time series based on the reference EMI signals collected over a predetermined time period; selecting a subset of frequencies from the plurality of discrete frequencies based on the associated amplitude-time series; and generating the reference EMI fingerprint using the amplitude-time series associated with the selected frequencies.

In a further variation, the system selects the subset of frequencies by: computing cross-correlations between pairs of amplitude-time series associated with pairs of the plurality of frequencies; computing an average correlation coefficient for each of the plurality of frequencies; and selecting the subset of frequencies that are associated with the highest average correlation coefficients.

In a further variation, the system generates the target EMI fingerprint by: transforming the target EMI signals from a time-domain representation to a frequency-domain representation and, for each of the selected frequencies in the reference EMI fingerprint, generating an amplitude-time series based on the frequency-domain representation of the target EMI signals collected over time.

In a variation on this embodiment, the system trains a non-linear, non-parametric regression model using the reference EMI fingerprint for the certified authentic reference computer system.

In a further variation on this embodiment, the system compares the target EMI fingerprint against the reference EMI fingerprint as follows: for each of the selected frequencies, producing an estimated amplitude-time series signal using the regression model, and comparing a corresponding amplitude-time series signal in the target EMI fingerprint with the estimated amplitude-time series signal produced by the regression model; and determining from the comparison whether the target EMI fingerprint matches the estimated signals produced by the regression model.

In a further variation, the system determines whether the target EMI fingerprint matches the estimated signals by: computing a residual signal between a corresponding pair of amplitude-time series; and detecting anomalies in the residual signal by using sequential detection techniques.

In a variation on this embodiment, the one or more antennas are positioned outside of the chassis of the target computer system.

In a variation on this embodiment, the one or more antennas are positioned at a predetermined distance from and orientation to the chassis of the target computer system.

In a variation on this embodiment, the one or more antennas are positioned inside a chassis for the target computer system.

In a variation on this embodiment, the one or more antennas are positioned in the vicinity of a target component with the target computer system.

In a variation on this embodiment, multiple antennas are positioned in the vicinity of multiple target components within the target computer system.

In a variation on this embodiment, the one or more antennas used to collect the reference EMI signals are placed in substantially the same manner with respect to the reference computer system as the one or more antennas used to collect the reference EMI signals are placed with respect to the target computer system.

In a variation on this embodiment, each antenna can be a wire.

In a further variation on this embodiment, the wire is a striped wire.

Another embodiment of the present invention provides a system that non-intrusively detects counterfeit components within a target computer system. During operation, the system collects target electromagnetic interference (EMI) signals generated by a target component within the target computer system using one or more antennas positioned in close proximity to the target component. The system then generates a target EMI fingerprint for the target component from the target EMI signals. Next, the system compares the target EMI fingerprint against a reference EMI fingerprint associated with the target component within a certified authentic computer system of the same type as the target computer system. The system then determines whether the target component within the target computer system is a counterfeit component based on the comparison result.

In a variation on this embodiment, prior to collecting the target EMI signals, the system generates the reference EMI fingerprint by: collecting reference EMI signals generated by the target component within the certified authentic reference computer system using one or more antennas positioned in close proximity to the target component; and generating the reference EMI fingerprint for the target component from the reference EMI signals.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 6 presents a flowchart illustrating the process of generating the reference EMI fingerprint from the collected reference EMI signals in accordance with an embodiment of the present invention.

FIG. 7 presents a flowchart illustrating the process of selecting the subset of frequencies based on the correlations between amplitude-time series in accordance with an embodiment of the present invention.

DETAILED DESCRIPTION

Figure 1:
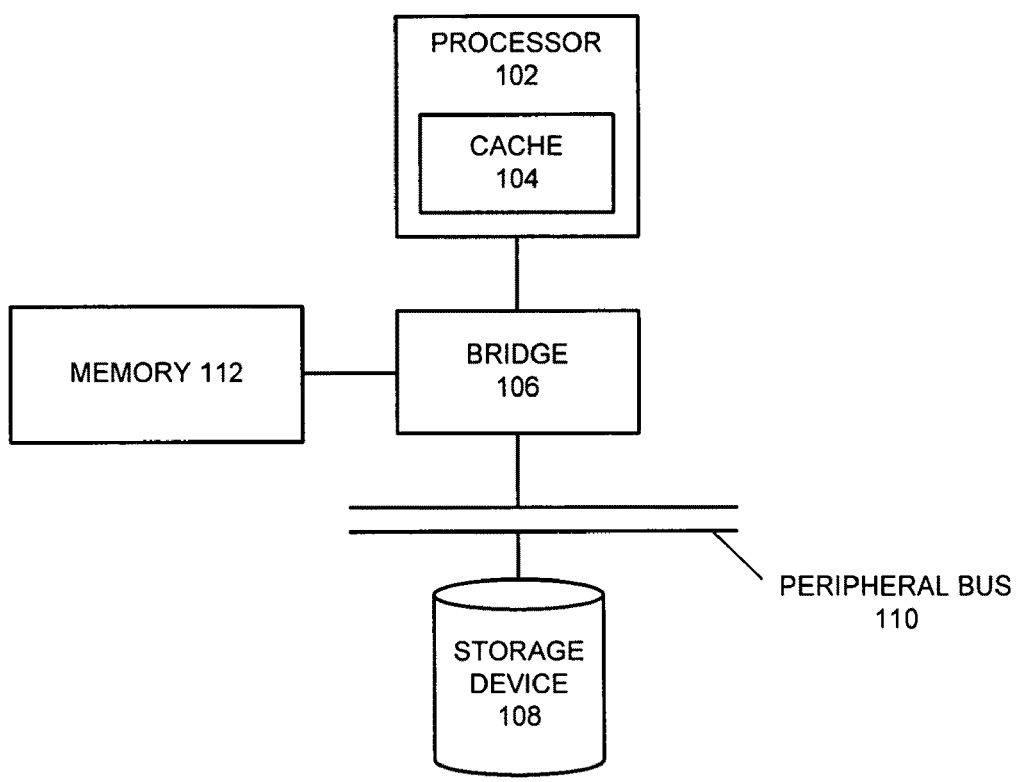
FIG. 1 illustrates a computer system in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Electromagnetic interference (EMI) signals are generated by computer systems or other electronic systems during operation. These EMI signals are commonly regarded as noise, and electronic systems are often shielded to minimize the amount of EMI signals emitted by the electronic system. However, these EMI signals can also carry information that can be used to generate unique fingerprints for system components. One embodiment of the present invention provides a technique that non-intrusively detects counterfeit components within a target electronic system by analyzing such EMI signals collected from the electronic system.

Although we describe the present invention in the context of a specific computer system below, the general principles and techniques of the present invention can be applied to any electronic system that comprises at least one electronic component.

In one embodiment of the present invention, EMI time-series signals generated by an authentic reference computer system ("reference computer system" hereafter) are collected using an EMI sensor positioned in close proximity to the reference computer system. One embodiment of the present invention then produces from the collected EMI time-series signals a reference EMI fingerprint that is unique and identical for all computer systems of the same type, which contain the same set of authentic components as the reference computer system. In one embodiment, the EMI time-series signals are generated and collected when the reference computer system is executing a given sequence of code.

In one embodiment of the present invention, EMI time-series signals generated by a target computer system of the same type as the reference computer system are collected using an EMI sensor positioned in close proximity to the target computer system. One embodiment of the present invention then produces from the collected EMI time-series signals an EMI fingerprint that is characteristic of the target computer system. In one embodiment, the EMI time-series signals are generated and collected when the target computer system is executing the same sequence of code used to generate the reference EMI fingerprint.

One embodiment of the present invention compares the EMI fingerprint of the target computer system with the reference EMI fingerprint associated with the reference computer system. In one embodiment of the present invention, this comparison involves using an advanced pattern-recognition technique. The comparison results are used to determine whether counterfeit components are present in the target computer system.

In one embodiment of the present invention, the EMI sensor is an antenna that can be placed either inside or outside the chassis of the target computer system. In one embodiment of the present invention, the antenna is a piece of stripped wire of a predetermined length.

Computer System

FIG. 1 illustrates a computer system 100 in accordance with an embodiment of the present invention. As illustrated in FIG. 1, computer system 100 includes processor 102, which is coupled to a memory 112 and to peripheral bus 110 through bridge 106. Bridge 106 can generally include any type of circuitry for coupling components of computer system 100 together.

Processor 102 can include any type of processor, including, but not limited to, a microprocessor, a mainframe computer, a digital signal processor, a personal organizer, a device controller and a computational engine within an appliance, and any other processor now known or later developed. Furthermore, processor 102 can include one or more cores. Processor 102 includes a cache 104 that stores code and data for execution by processor 102.

Although FIG. 1 illustrates computer system 100 with one processor, computer system 100 can include more than one processor. In a multi-processor configuration, the processors can be located on a single system board, or on multiple system boards.

Processor 102 communicates with storage device 108 through bridge 106 and peripheral bus 110. Storage device 108 can include any type of non-volatile storage device that can be coupled to a computer system. This includes, but is not limited to, magnetic, optical, and magneto-optical storage devices, as well as storage devices based on flash memory and/or battery-backed up memory.

Processor 102 communicates with memory 112 through bridge 106. Memory 112 can include any type of memory that can store code and data for execution by processor 102. This includes, but is not limited to, dynamic random access memory (DRAM), static random access memory (SRAM), flash memory, read only memory (ROM), and any other type of memory now known or later developed.

Note that although the present invention is described in the context of computer system 100 as illustrated in FIG. 1, the present invention can generally operate on any type of computing device. Hence, the present invention is not limited to the specific implementation of computer system 100 as illustrated in FIG. 1.

Note that during operation, computer system 100 generates EMI signals when the system is powered up.

Dynamic Counterfeit Detection Using EMI Telemetric Signals

In one embodiment of the present invention, prior to performing a counterfeit detection, EMI time-series signals generated by a certified, authentic reference computer system ("reference computer system" hereafter) are collected. In one embodiment, the EMI signals are collected while the reference computer system is running a particular load script. One embodiment of the present invention then generates a reference EMI fingerprint from the EMI signals, wherein the reference EMI fingerprint is unique for a computer system of the same type as the reference computer system which contains only certified authentic components. Next, the counterfeit detection is performed on a target computer system of the same type as the reference computer system, wherein the target computer system may contain one or more counterfeit components. Note that both the "training" process on the reference computer system and the detection process on the target computer system require monitoring and collecting of associated EMI time-series signals. Hence, although the EMI signal detection techniques described below are in the context of the target computer system, they are also applicable to EMI signal sensing on the reference computer system.

External (Global) EMI Signal Detection Configuration

Figure 2A:
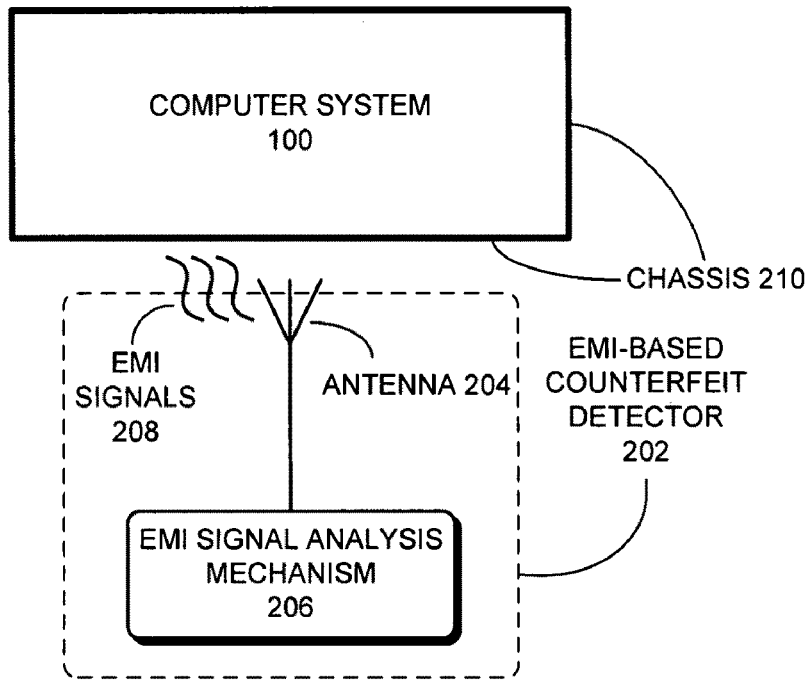
FIG. 2A illustrates a computer system and an associated EMI-based counterfeit detector in an external (global) detection configuration in accordance with an embodiment of the present invention.

FIG. 2A illustrates computer system 100 and an associated EMI-based counterfeit detector 202 in an external (global) detection configuration in accordance with an embodiment of the present invention. Specifically, EMI-based counterfeit detector 202 further includes an EMI signal sensor 204 and an EMI signal analysis mechanism 206. In particular, EMI signal sensor 204 is an antenna 204, which is coupled to EMI signal analysis mechanism 206.

Note that the counterfeit detection is performed after computer system 100 is powered up. When powered up, computer system 100 generates EMI signals 208 from a plurality of electronic components, which include, but are not limited to: a central processing unit (CPU), a graphics processing unit (GPU), a hard disk drive (HDD), and memory chips. Antenna 204 is configured to sense EMI signals 208 and couple the signals to EMI signal analysis mechanism 206. EMI signal analysis mechanism 206 analyses EMI signals 208 to determine if one or more components within computer system 100 are counterfeit components. In one embodiment of the present invention, the EMI signal analysis involves comparing the collected EMI signals with a reference EMI fingerprint associated with the reference computer system. EMI signal analysis mechanism 206 is described in more detail below.

Note that antenna 204 in FIG. 2A is positioned outside chassis 210 of computer system 100, i.e., in an external detection configuration. More specifically, antenna 204 can be positioned either in close proximity to computer system 100, or further away from computer system 100. To achieve better sensitivity in antenna 204 and hence higher signal-to-noise ratio (SNR) in counterfeit detector 202, a smaller distance between computer system 100 and antenna 204 is preferred. In addition to distance, the sensitivity of antenna 204 can also be affected by its orientation with respect to computer system 100. Also note that antenna 204 can be positioned in close proximity (but externally) to a specific component within computer system 100 that is deemed to be prone to counterfeiting (e.g., due to the value of the specific component or to a known history of high counterfeiting rates).

In one embodiment of the present invention, antenna 204 is positioned at a predetermined distance and orientation with respect to computer system 100. Furthermore, the same distance and orientation are used to detect the reference EMI signals from the reference computer system prior to performing the external detection. The consistency of antenna placement with respect to the systems being monitored can increase the ability of the technique to discriminate between the reference EMI signals and EMI signals 208.

Using the illustrated external detection configuration, EMI emissions from a collection of components within computer system 100 are collected by antenna 204. In one embodiment, this external detection configuration can be used to generate a complex EMI fingerprint for the entire system.

Internal (Local) EMI Detection Configuration

Figure 2B:
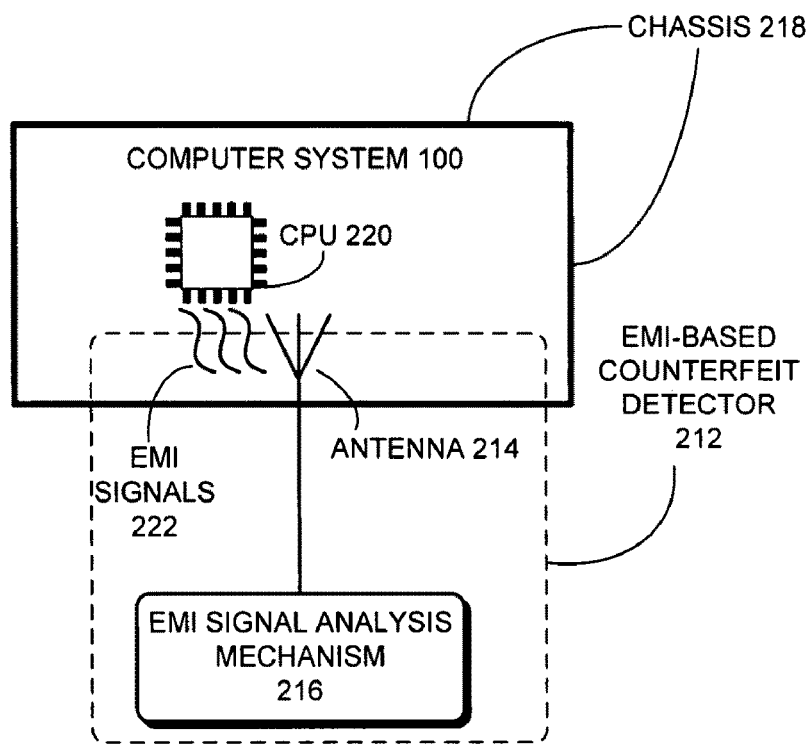
FIG. 2B illustrates a computer system and an associated EMI-based counterfeit detector in an internal (local) detection configuration in accordance with an embodiment of the present invention.

FIG. 2B illustrates computer system 100 and an associated EMI-based counterfeit detector 212 in an internal (local) detection configuration in accordance with an embodiment of the present invention. In one embodiment, counterfeit detector 212 further includes an antenna 214 coupled to an EMI signal analysis mechanism 216.

Note that antenna 214 in FIG. 2B is positioned inside chassis 218 of computer system 100 in an internal detection configuration. For example, antenna 214 can be positioned inside chassis 218 through an opening on chassis 218. In one embodiment of the present invention, antenna 214 can be placed at a fixed position within a specified distance of a target component within computer system 100. For example, in FIG. 2B antenna 214 is placed at a specific location in the vicinity of a CPU 220. In this configuration, antenna 214 can be used to pick up EMI signals 222 generated by CPU 220 with a high SNR. Note that, in addition to the distance, the sensitivity of antenna 214 can also be affected by its orientation with respect to CPU 220.

In another embodiment of the present invention, antenna 214 is manually moved to multiple fixed positions inside computer system 100. In this embodiment, antenna 214 can be used to sequentially collect EMI emissions from multiple potential counterfeit components inside system 100 to achieve high SNRs.

In a further embodiment of the present invention, multiple antennas (not shown) can be simultaneously placed at multiple fixed positions inside computer system 100. In this embodiment, the system can simultaneously collect multiple high-SNR EMI signals from multiple potentially counterfeit components. For example, one antenna can be located within a specified distance of each of the CPUs in a multi-processor system. In this embodiment, EMI signal analysis mechanism 216 receives multiple channels of EMI signals sensed by the multiple antennas.

Note that both the external detection technique of FIG. 2A and internal detection technique of FIG. 2B can detect either a single counterfeit component in the system or a completely counterfeit system (i.e., wherein most or all the components have been counterfeited). Compared with internal detection, external detection is non-intrusive and easier to implement. However, external detection may not provide a sufficiently high SNR to discriminate a single counterfeit component inside the system that does not perturb the global EMI fingerprint significantly. In contrast, internal detection may be more difficult to implement and can require a more complex signal analyzing mechanism (for multiple EMI signals from multiple antennas). However, the internal detection can achieve better SNR performance for discriminating a single counterfeiting component.

Note that the placement of an antenna in relation to a computer system is not meant to be limited to the particular configurations illustrated in FIGS. 2A and 2B.

Antenna

In one embodiment of the present invention, antenna 204 or antenna 214 can include: a dipole antenna, a Yagi-Uda antenna, a loop antenna, an electrical short antenna (e.g., an open-ended wire having a length less than a quarter wavelength), a fractal antenna, a parabolic antenna, a microstrip antenna, a quad antenna, a random wire antenna (e.g., an open-ended wire having a length greater than one wavelength), a beverage antenna, a helical antenna, a phased array antenna, and any other type of antenna now known or later developed.

In one embodiment of the present invention, antenna 204 or antenna 214 is an insulated wire with a fixed length of the insulation stripped off. In this embodiment, the stripped end of the insulated wire is open to free space and the other end of the wire is coupled to the associated receiving mechanism. In one embodiment of the present invention, the stripped length is approximately ½ inch. In another embodiment of the present invention, the length of the antenna can be selected to achieve optimal discrimination sensitivity and robustness. Note that while many types of antennas can be used to collect the EMI signals, stripped wire provides a simple and inexpensive option.

EMI Signal Analysis Mechanism

Figure 3:
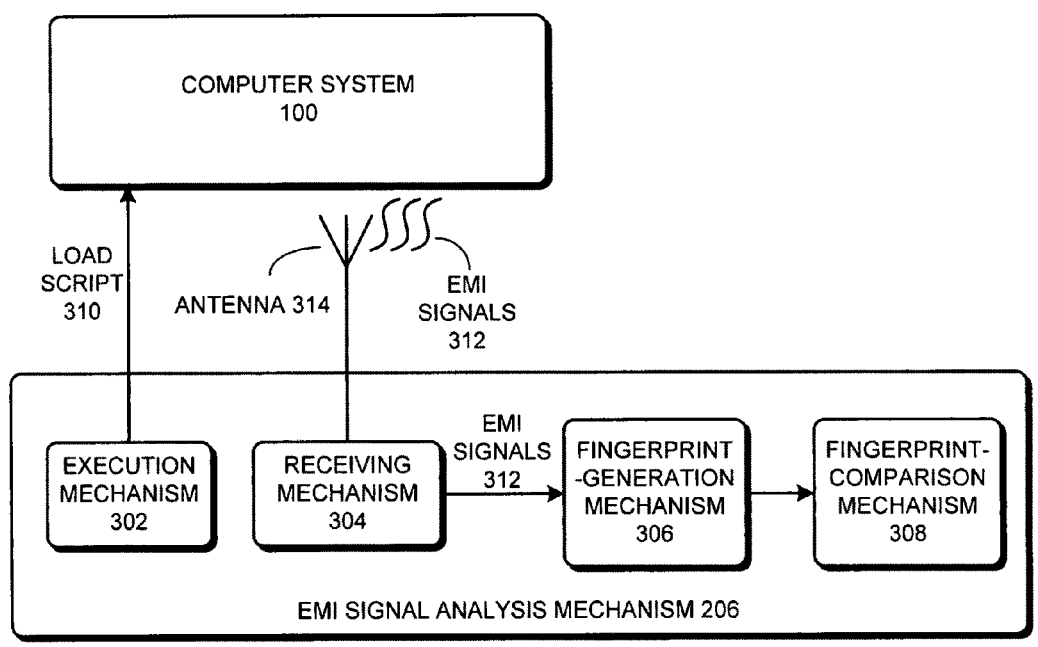
FIG. 3 illustrates the detailed structure of an EMI signal analysis mechanism in accordance with an embodiment of the present invention.

FIG. 3 illustrates the detailed structure of an EMI signal analysis mechanism 206 (or 216) in accordance with an embodiment of the present invention. EMI signal analysis mechanism 206 (or 216) includes: an execution mechanism 302, a receiving mechanism 304, a fingerprint-generation mechanism 306, and a fingerprint-comparison mechanism 308. Note that FIG. 3 should be viewed in the context of FIGS. 2A and 2B.

In one embodiment of the present invention, execution mechanism 302 causes load script 310 to be executed by computer system 100. For example, execution mechanism 302 can transmit load script 310 and a command to execute load script 310 across a wired or wireless network to computer system 100. In another embodiment of the present invention, execution mechanism 302 is embedded in computer system 100 and is located outside of EMI signal analysis mechanism 206 (or 216). In this embodiment, load script 310 is preloaded onto computer system 100 and execution mechanism 302 is configured to execute load script 310 during a counterfeit-detection process. In yet another embodiment, execution mechanism 302, which is associated with EMI signal analysis mechanism 206 (or 216), can cause execution of load script 310 which is stored on computer system 100.

In one embodiment of the present invention, load script 310 can include: a sequence of operations that produces a load profile that oscillates between specified CPU utilization percentages; and/or a sequence of operations that produces a customized load profile. Note that a customized load profile can be used to produce a unique fingerprint which is difficult to spoof.

In one embodiment of the present invention, during the execution of load script 310, computer system 100 generates EMI signals 312 which are collected by antenna 314, which is placed either inside or in the vicinity of computer system 100. In one embodiment of the present invention, antenna 314 is coupled to a receiving mechanism 304, which receives EMI signals 312 collected by antenna 314. In one embodiment of the present invention, the EMI signals are amplified by receiving mechanism 304.

In one embodiment of the present invention, receiving mechanism 304 is coupled to fingerprint-generation mechanism 306. Fingerprint-generation mechanism 306 generates an EMI fingerprint for computer system 100 from EMI signals 312. This process is described in more detail below. In one embodiment of the present invention, fingerprint-comparison mechanism 308 compares the EMI fingerprint from fingerprint-generation mechanism 306 to a reference EMI fingerprint to determine whether computer system 100 contains one or more counterfeit components. In one embodiment, the reference EMI fingerprint is generated from a certified authentic reference computer system while executing the same load script. We describe the process of generating the reference EMI fingerprint in more detail below in conjunction with FIG. 5.

Although we describe EMI signals 312 as being generated by computer system 100 while executing a predetermined load script, EMI signals 312 can also be generated during other execution states of computer system 100. In one embodiment of the present invention, EMI signals 312 are generated while computer system 100 is idling. Note that the EMI fingerprint associated with execution of a dynamic load script typically possesses a richer feature content which helps to increase discrimination capabilities.

Figure 4:
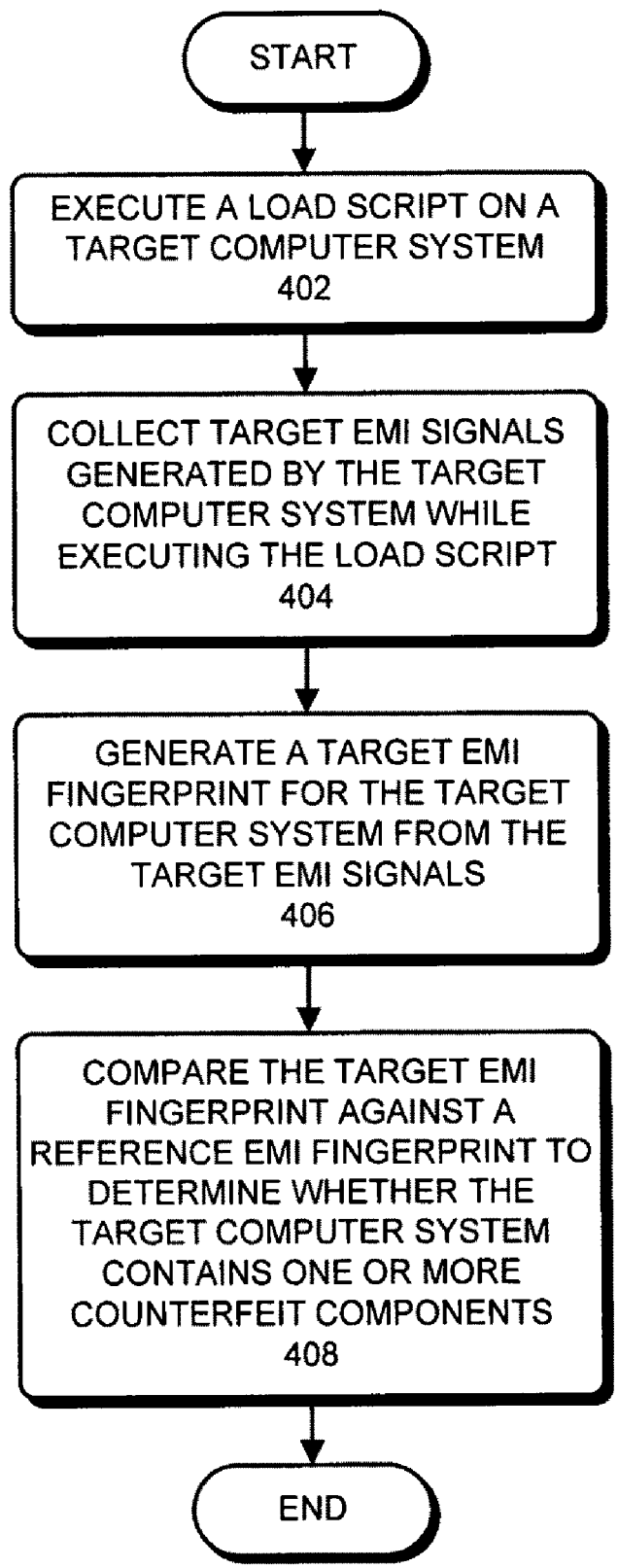
FIG. 4 presents a flowchart illustrating the process of detecting counterfeit components in a target computer system based on EMI fingerprints in accordance with an embodiment of the present invention.

FIG. 4 presents a flowchart illustrating the process of detecting counterfeit components in a target computer system based on EMI fingerprints in accordance with an embodiment of the present invention. During operation, the system executes a load script on a target computer system, wherein the load script includes a specified sequence of operations (step 402). In one embodiment of the present invention, the load script is a dynamic load script which changes the load on the CPU as a function of time. Next, the system collects target EMI signals generated by the target computer system while executing the load script (step 404). In one embodiment of the present invention, the system collects the EMI signals using one or more antennas positioned in close proximity to the target computer system. In one embodiment of the present invention, EMI signals are time-series signals.

The system then generates a target EMI fingerprint for the target computer system from the target EMI signals (step 406). We describe this step in more detail below. Next, the system compares the target EMI fingerprint against a reference EMI fingerprint to determine whether the target computer system contains one or more counterfeit components (step 408). We describe the details of comparing the two EMI fingerprints below in conjunction with FIG. 10.

Note that the reference EMI fingerprint is associated with an authentic reference computer system of the same type as the target computer system. We describe the process of generating the reference EMI fingerprint below in conjunction with FIG. 9. Note that the process of generating the target EMI fingerprint shares many of the same steps for generating the reference EMI fingerprint.

Generating the Reference EMI Fingerprint

Figure 5:
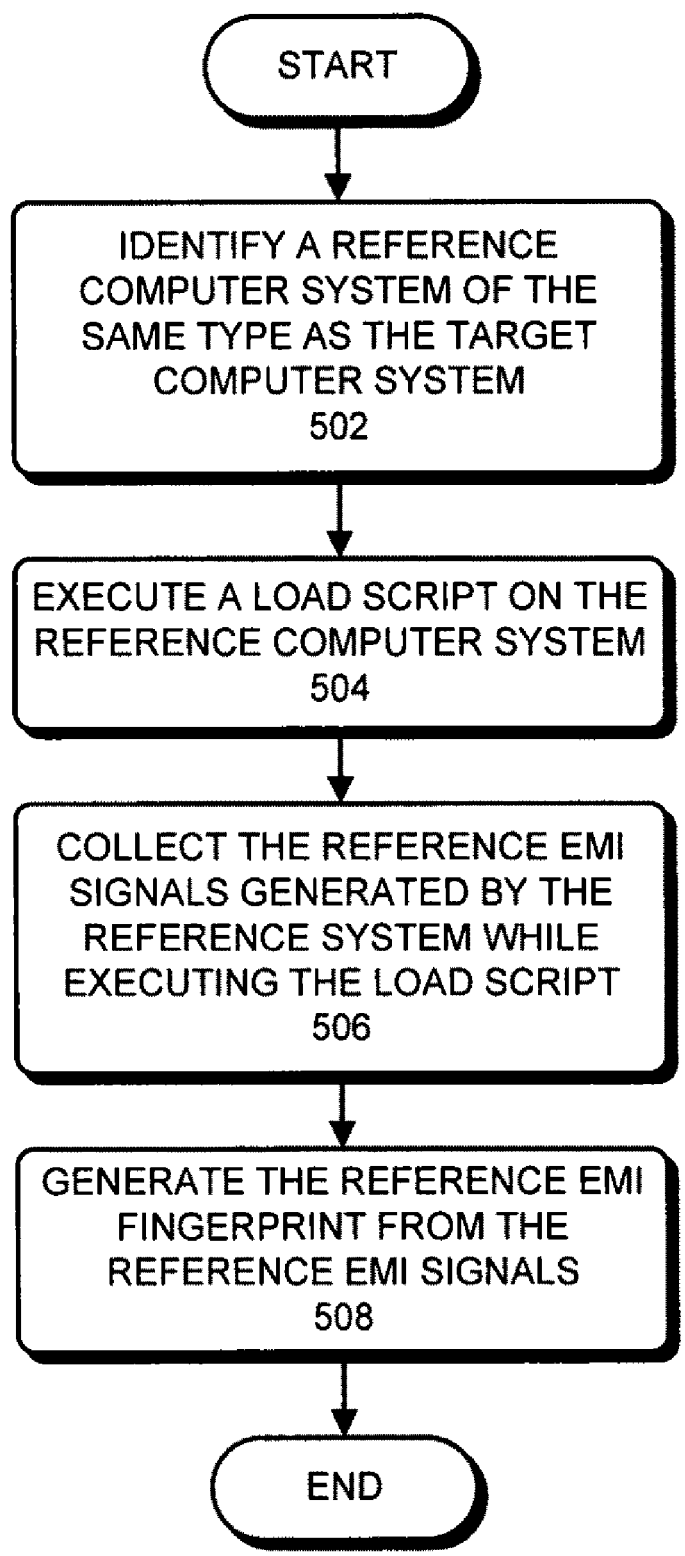
FIG. 5 presents a flowchart illustrating the process of generating a reference EMI fingerprint from a certified authentic reference computer system in accordance with an embodiment of the present invention.

FIG. 5 presents a flowchart illustrating the process of generating a reference EMI fingerprint from a certified authentic reference computer system in accordance with an embodiment of the present invention.

During operation, the system starts by identifying a certified authentic reference computer system ("reference computer system" hereafter) of the same type as the target computer system (step 502). In one embodiment of the present invention, this reference computer system contains only certified authentic components.

Next, the system executes a load script on the reference computer system (step 504). In one embodiment of the present invention, the load script executed by the reference computer system is the same load script which is executed on the target computer system during the counterfeit detection process of FIG. 4. In other words, the same load script is used for generating both the reference EMI fingerprint and the target EMI fingerprint. In one embodiment, the load script is a dynamic load script which changes load with time.

The system then collects reference EMI signals generated by the reference computer system while executing the load script (step 506). In one embodiment of the present invention, the system collects the reference EMI signals using one or more antennas positioned in close proximity to the reference computer system. In a further embodiment of the present invention, the system collects the reference EMI signals using one or more antennas placed inside of the reference computer system. In one embodiment of the present invention, the received reference EMI signals are time-series signals. Next, the system generates the reference EMI fingerprint from the received reference EMI signals (step 508).

FIG. 6 presents a flowchart illustrating the process of generating the reference EMI fingerprint from the collected reference EMI signals in accordance with an embodiment of the present invention.

During operation, the system starts by transforming the reference EMI time-series signals from the time domain to the frequency domain (step 602). In one embodiment of the present invention, transforming the EMI time-series signals from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

The system then divides the frequency range associated with the frequency-domain representation of the reference EMI signals into a plurality of "bins," and represents each discrete bin with a representative frequency value (step 604). In one embodiment, these frequency bins and the associated frequency values are equally spaced.

Next, for each of the plurality of representative frequencies, the system constructs an amplitude-time series based on the reference EMI signals collected over a predetermined time period (step 606). In one embodiment, to generate the time-series for each frequency, the reference EMI signals are collected at predetermined time intervals, for example once every second. The newly collected EMI signals are then transformed into the frequency domain, and an amplitude-time pair is subsequently extracted for each of the representative frequencies. Next, new reference EMI signals are collected over the next time interval to extract the next amplitude-time pair. In this way, the system generates a large number of amplitude-time series for the plurality of frequencies.

Next, the system selects a subset of frequencies from the plurality of representative frequencies based on the associated amplitude-time series (step 608). Specifically, FIG. 7 presents a flowchart illustrating the process of selecting the subset of frequencies based on the correlations between amplitude-time series in accordance with an embodiment of the present invention.

During operation, the system computes cross-correlations between pairs of amplitude-time series associated with pairs of the representative frequencies (step 702). Next, the system computes an average correlation coefficient for each of the plurality of representative frequencies (step 704). The system then ranks and selects a subset of N representative frequency values that are associated with the highest average correlation coefficients (step 706). Note that the amplitude-time series associated with these N frequency values are the most highly correlated with other amplitude-time series. In one embodiment of the present invention, N is typically less than or equal to 20. We refer to these selected frequencies as "signature frequencies."

Referring back to FIG. 6, when the signature frequencies are selected, the system generates the reference EMI fingerprint using the amplitude-time series associated with the signature frequencies (step 610).

Figure 8:
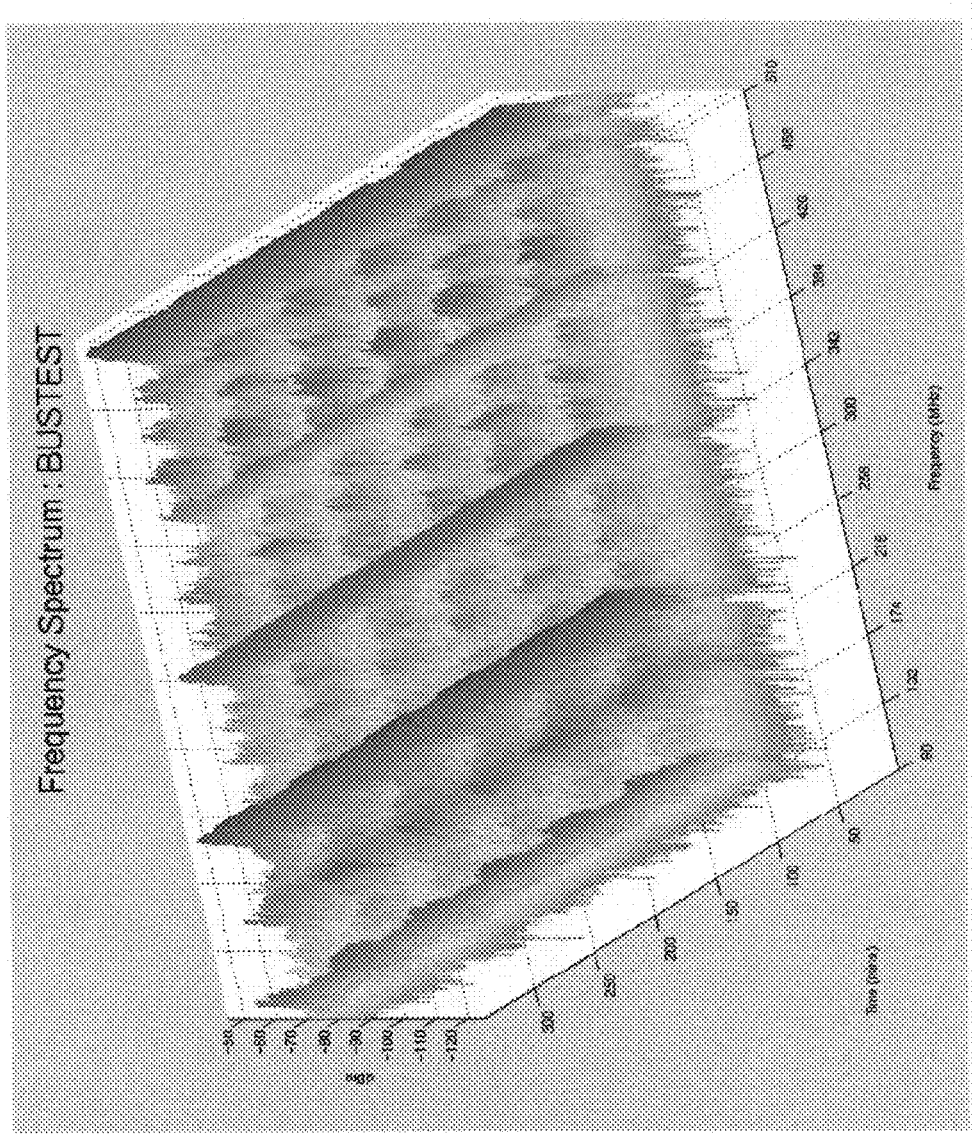
FIG. 8 illustrates a portion of a combined frequency-spectrum-time series produced from the reference EMI signals generated by a reference computer system while executing a load script in accordance with an embodiment of the present invention.

FIG. 8 illustrates a portion of a combined frequency-spectrum-time series produced from the reference EMI signals generated by a reference computer system while executing a load script in accordance with an embodiment of the present invention. Specifically, the frequency-spectrum-time series illustrated in FIG. 8 was observed during execution of a load named "BUSTEST." Note that for any discrete frequency bin, the time observations (along the time axis) trace out a time series signature. Correlation patterns can be clearly observed between different frequency-time series. Hence, the reference EMI fingerprint can be extracted from these correlation patterns.

Note that although the above description associated with FIGS. 4-7 is based on a process in which both the reference computer system and the target computer system generate the EMI signals while executing a specific load script, other embodiments of the present invention do not require execution of such a load script. For example, both the target EMI signals and the reference EMI signals can be collected when the target computer system and the reference computer system are idle (but powered up), or when each is running different programs.

In one embodiment of the present invention, the selected N time-series (i.e., the reference EMI fingerprint) are used to train a non-linear, non-parametric (NLNP) regression model. In one embodiment of the present invention, the NLNP regression module is generated using a multivariate state estimation technique (MSET). The term "MSET" as used in this specification refers to a class of pattern recognition algorithms. For example, see "Use of Kernel Based Techniques for Sensor Validation in Nuclear Power Plants," by Andrei V. Gribok, J. Wesley Hines, and Robert E. Uhrig, The Third American Nuclear Society International Topical Meeting on Nuclear Plant Instrumentation and Control and Human-Machine Interface Technologies, Washington D.C., Nov. 13-17, 2000 (Gribok hereafter). This paper outlines several different pattern recognition approaches. Hence, the term "MSET" as used in this specification can refer to (among other things) any technique outlined in Gribok, including Ordinary Least Squares (OLS), Support Vector Machines (SVM), Artificial Neural Networks (ANNs), MSET, or Regularized MSET (RMSET).

Because the NLNP regression module is trained based on the certified authentic computer system, the NLNP regression module can be subsequently used in a comparison against a target EMI fingerprint generated from the target computer system.

Generating the Target EMI Fingerprint

Figure 9:
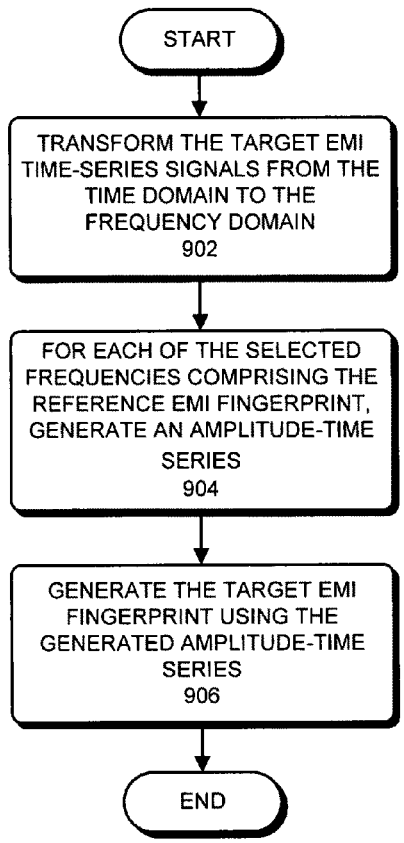
FIG. 9 presents a flowchart illustrating the process of generating a target EMI fingerprint for the target computer system in accordance with an embodiment of the present invention.

FIG. 9 presents a flowchart illustrating the process of generating a target EMI fingerprint for the target computer system in accordance with an embodiment of the present invention.

Note that the target EMI fingerprint for the target computer system can be generated from the target EMI signals in a similar manner to generating the reference EMI fingerprint. Specifically, the system can transform the target EMI time-series signals from the time domain to the frequency domain, for example by using an FFT technique (step 902). Next, for each of the signature frequencies comprising the reference EMI fingerprint, the system generates an amplitude-time series in the same manner as construction of the amplitude-time series in conjunction with step 604 (step 904). The system then generates the target EMI fingerprint using the generated amplitude-time series (step 906). In one embodiment of the present invention, the target EMI fingerprint comprises all the signature frequencies as the reference EMI fingerprint. In a further embodiment, the target EMI fingerprint comprises a subset of the signature frequencies in the reference EMI fingerprint.

Comparing the Reference and Target EMI Fingerprints

Figure 10:
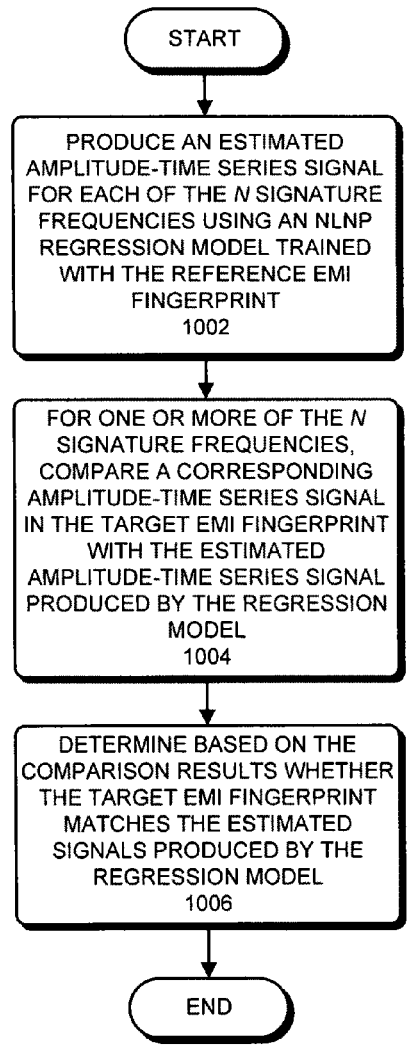
FIG. 10 presents a flowchart illustrating the process of comparing the target EMI fingerprint against the reference EMI fingerprint to determine whether the target computer system contains a counterfeit component in accordance with an embodiment of the present invention.

FIG. 10 presents a flowchart illustrating the process of comparing the target EMI fingerprint against the reference EMI fingerprint to determine whether the target computer system contains a counterfeit component in accordance with an embodiment of the present invention.

During operation, the system produces an estimated amplitude-time series signal for each of the N signature frequencies using an NLNP regression model trained with the reference EMI fingerprint (step 1002). In one embodiment of the present invention, the NLNP regression model is an MSET model. In this embodiment, the MSET model is generated by performing an analytical estimation based on the correlation between the reference EMI fingerprint and the target EMI time-series at each corresponding selected frequency.

Next, for one or more of the N signature frequencies, the system compares a corresponding amplitude-time series signal in the target EMI fingerprint with the estimated amplitude-time series signal produced by the regression model (step 1004). In one embodiment of the present invention, comparing the time series involves first computing a residual signal between a corresponding pair of amplitude-time series, and then detecting anomalies in the residual signal using sequential detection techniques. In one embodiment of the present invention, the sequential detection techniques include the Sequential Probability Ratio Test (SPRT). Note that the system can determine if the two signals match based on the SPRT alarm rate. The system then determines based on the comparison results whether the target EMI fingerprint matches the estimated signals produced by the regression model (step 1006). In one embodiment of the present invention, the system determines that the target computer system contains one or more counterfeit components if the target EMI signals and the reference EMI signals do not match at one or more of the signature frequencies.

Note that the comparison process described in conjunction with FIG. 10 can be performed both in real-time or offline. In an offline scenario, the target EMI signals are first collected but comparison operations are performed offline.

Examples

FIGS. 11A-11D illustrate an exemplary application that uses EMI fingerprints to detect counterfeit hard disk drives (HDDs) in accordance with an embodiment of the present invention. In order to "simulate" a counterfeit component, we selected two interchangeable HDDs having identical specifications, but different internal circuitry. The HDDs manufactured by Company A are treated as the authentic reference HDDs, whereas the mechanically interchangeable "simulated counterfeit" HDDs are manufactured by Company B.

Figure 11A:
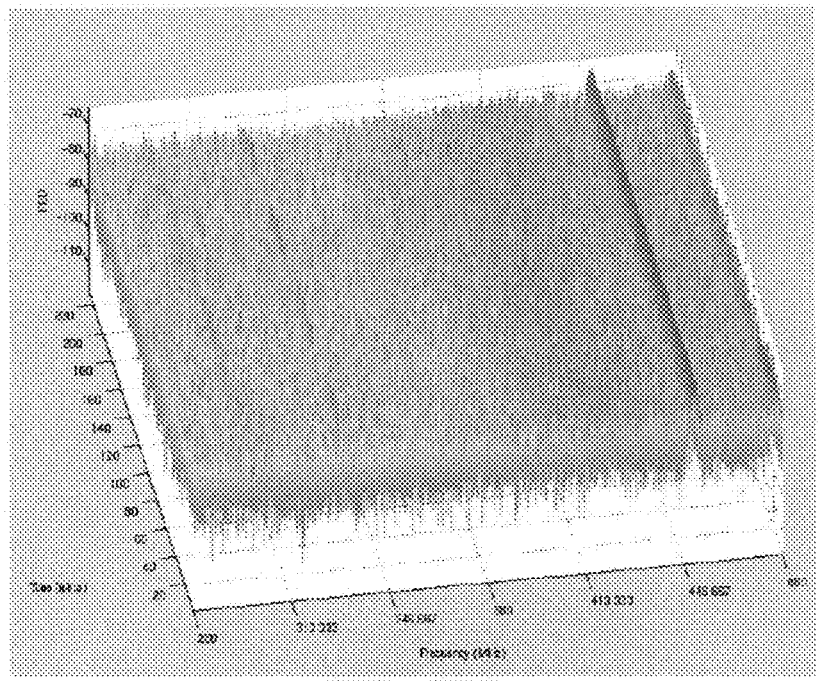
FIG. 11A illustrates a portion of a combined frequency-spectrum-time-series corresponding to EMI signals generated by a disk drive from Company-A while executing random reads in accordance with an embodiment of the present invention.
Figure 11B:
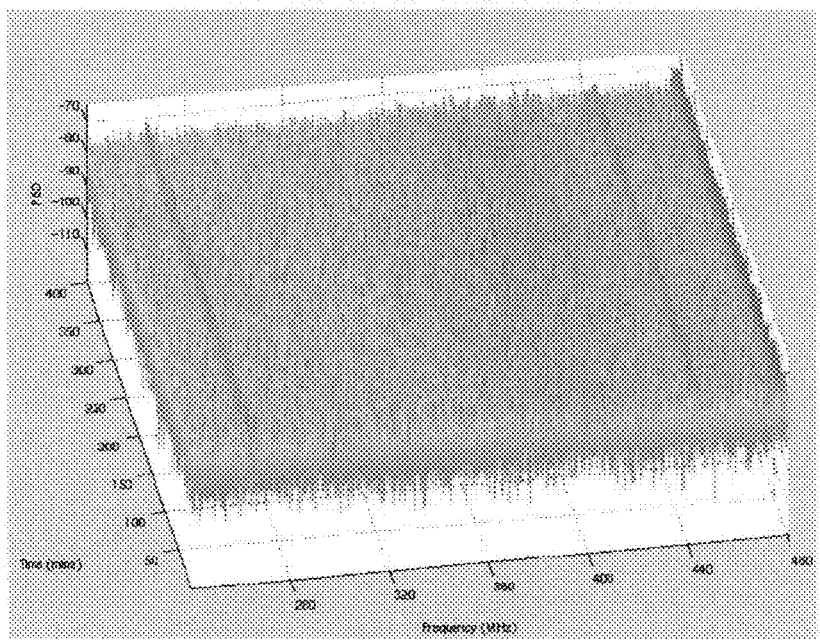
FIG. 11B illustrates a portion of a combined frequency-spectrum-time series corresponding to EMI signals generated by a disk drive from Company-B while executing random reads in accordance with an embodiment of the present invention.

FIG. 11A illustrates a portion of a combined frequency-spectrum-time-series corresponding to EMI signals generated by a disk drive from Company-A while executing random reads in accordance with an embodiment of the present invention. Similarly, FIG. 11B illustrates a portion of a combined frequency-spectrum-time series corresponding to EMI signals generated by a disk drive from Company-B while executing random reads in accordance with an embodiment of the present invention.

In the above-described fingerprint generation process, the reference and target EMI fingerprints can be generated from these plots wherein each fingerprint comprises a set of signature frequency components for the subsequent comparison.

Figure 11C:
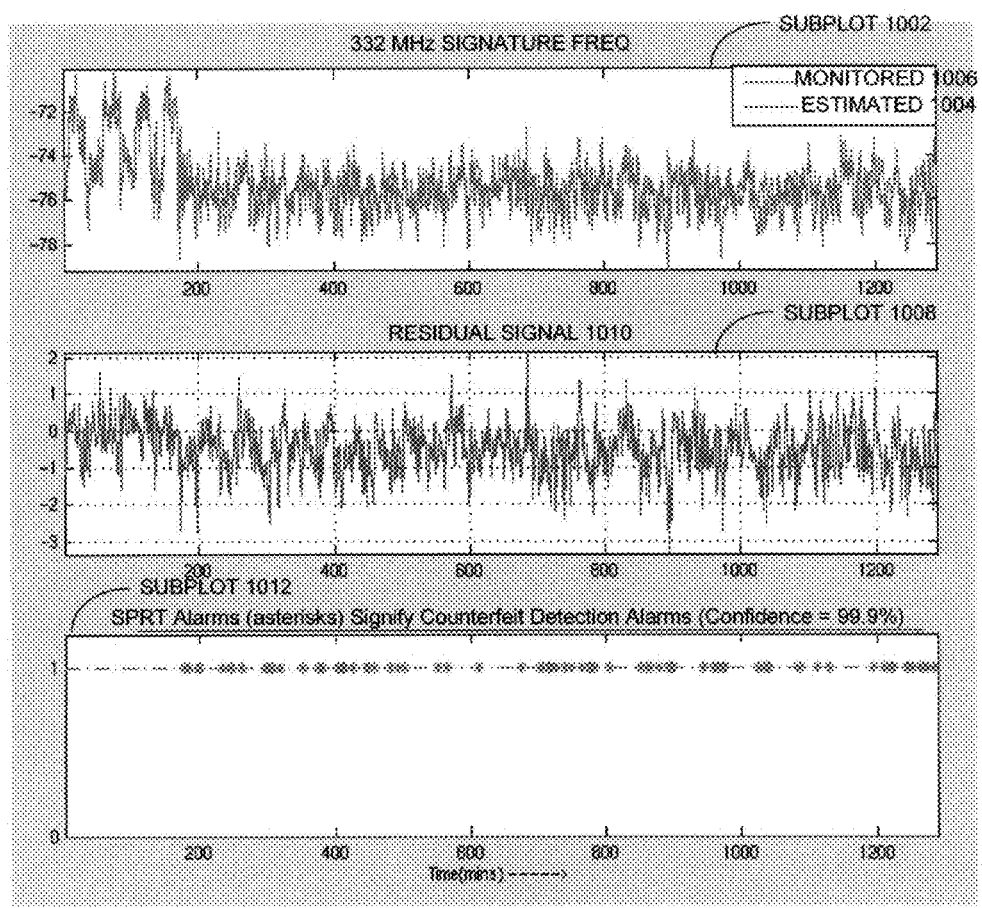
FIG. 11C illustrates the process of comparing the 332 MHz signature in the target EMI fingerprint of the disk drive from Company-B and in the reference EMI fingerprint of the disk drive from Company-A in accordance with an embodiment of the present invention.

FIG. 11C illustrates the process of comparing the 332 MHz signature in the target EMI fingerprint of the disk drive from Company-B and in the reference EMI fingerprint of the disk drive from Company-A in accordance with an embodiment of the present invention. More specifically, subplot 1002 illustrates two time series data: an estimated time-series signal 1004 which is generated from the reference EMI fingerprint using the MSET technique described in conjunction with FIG. 10, step 1002; and a monitored time-series signal 1006 representing the target EMI fingerprint. Subplot 1008 illustrates a residual signal 1010 between estimated signal 1004 and monitored signal 1006. A Sequential Probability Ratio Test (SPRT) is then applied to residual signal 1010. Subplot 1012 illustrates the SPRT alarms based on residual signal 1010. Note that the large number of SPRT alarms in the bottom subplot indicates the two signals are not identical with a confidence factor of 99.9%. Consequently, the EMI signature at 332 MHz can be used to detect the "counterfeit module" with a very high confidence level.

Figure 11D:
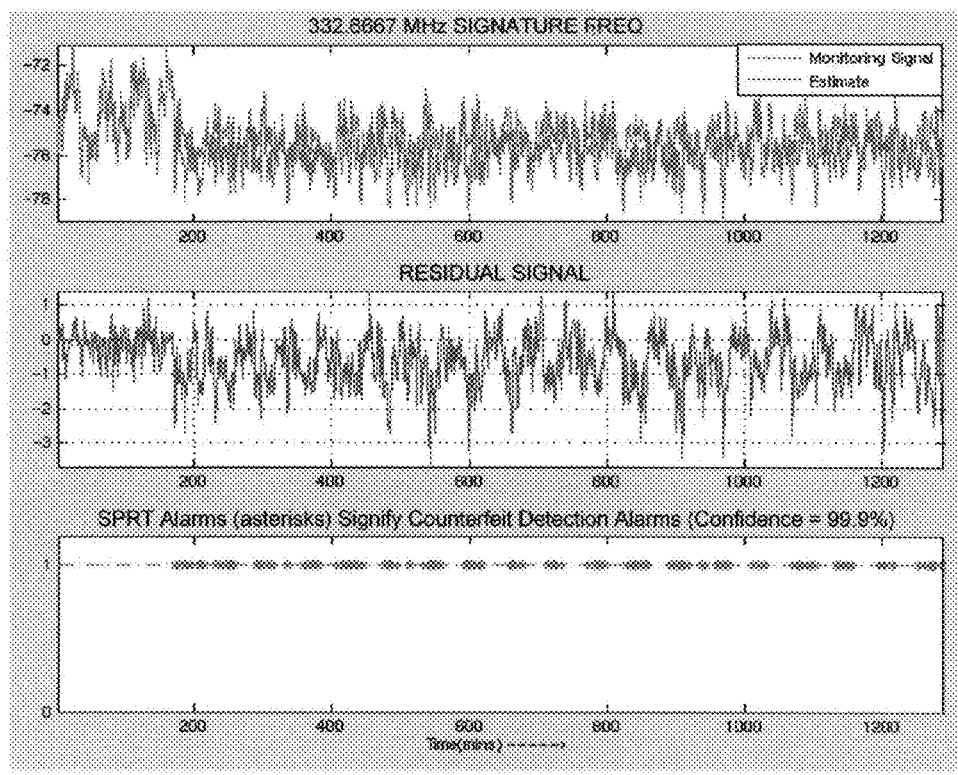
FIG. 11D illustrates the process of comparing the 332.6667 MHz signature in the target EMI fingerprint of the disk drive from Company-B and in the reference EMI fingerprint of the disk drive from Company-A in accordance with an embodiment of the present invention.

FIG. 11D illustrates the process of comparing the 332.6667 MHz signature in the target EMI fingerprint of the disk drive from Company-B and in the reference EMI fingerprint of the disk drive from Company-A in accordance with an embodiment of the present invention. Note that the SPRT alarm behavior is substantially the same as in FIG. 11C.

Conclusion

Embodiments of the present invention use distinctive EMI fingerprints as a non-intrusive means of detecting the presence of counterfeit components inside computer systems or other electronic systems that may include different types of internal integrated circuit boards, logic chips, memory chips, flash PROMs, etc. Note that the present invention may not work if the "counterfeit parts" and the authentic parts really are identical (e.g., if some systems are stolen and then the stolen goods are re-sold as authentic systems). Although stolen goods are a problem, a much bigger problem in the electronics industry is the counterfeiting of parts, wherein the internal integrated circuitry is different and (most likely) inferior to the authentic parts in terms of performance, quality, safety, and lifetime.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for non-intrusively detecting counterfeit components in a target computer system, comprising:
   collecting reference electromagnetic interference (EMI) signals generated by a reference computer system using one or more antennas positioned in close proximity to the reference computer system, wherein the reference EMI signals are generated by the reference computer system while a load script is executed by the reference computer system;
   generating a reference EMI fingerprint for the reference computer system from the reference EMI signals;
   collecting target EMI signals generated by the target computer system using one or more antennas positioned in close proximity to the target computer system, wherein the target EMI signals are generated by the target computer system while the load script is executed by the target computer system;
   generating a target EMI fingerprint for the target computer system from the target EMI signals; and
   comparing the target EMI fingerprint to the reference EMI fingerprint to determine whether the target computer system contains a counterfeit component.

2. The method of claim 1, wherein generating the reference EMI fingerprint involves:
   transforming the reference EMI signals from a time-domain representation to a frequency-domain representation, which is comprised of a plurality of discrete frequencies;
   for each of the plurality of discrete frequencies, constructing an amplitude-time series based on the reference EMI signals collected over a predetermined time period;
   selecting a subset of frequencies from the plurality of discrete frequencies based on the associated amplitude-time series; and
   generating the reference EMI fingerprint using the amplitude-time series associated with the selected frequencies.

3. The method of claim 2, wherein selecting the subset of frequencies involves:
   computing cross-correlations between pairs of amplitude-time series associated with pairs of the plurality of frequencies;
   computing an average correlation coefficient for each of the plurality of frequencies; and
   selecting the subset of frequencies that are associated with the highest average correlation coefficients.

4. The method of claim 2, wherein generating the target EMI fingerprint involves:
   transforming the target EMI signals from a time-domain representation to a frequency-domain representation; and
   for each of the selected frequencies in the reference EMI fingerprint, generating an amplitude-time series based on the frequency-domain representation of the target EMI signals collected over time.

5. The method of claim 1, wherein the method further comprises training a non-linear, non-parametric regression model using the reference EMI fingerprint for the reference computer system.

6. The method of claim 5, wherein comparing the target EMI fingerprint against the reference EMI fingerprint involves:
for each of the selected frequencies,
producing an estimated amplitude-time series signal using the regression model; and
comparing a corresponding amplitude-time series signal in the target EMI fingerprint with the estimated amplitude-time series signal produced by the regression model; and
determining from the comparison whether the target EMI fingerprint matches the estimated signals produced by the regression model.

7. The method of claim 6, wherein determining whether the target EMI fingerprint matches the estimated signals involves:
computing a residual signal between a corresponding pair of amplitude-time series; and
detecting anomalies in the residual signal by using sequential detection techniques.

8. The method of claim 1, wherein the one or more antennas are positioned outside of the chassis of the target computer system.

9. The method of claim 1, wherein the one or more antennas are positioned at a predetermined distance from and orientation to the chassis of the target computer system.

10. The method of clam 1, wherein the one or more antennas are positioned inside the chassis of the target computer system.

11. The method of claim 1, wherein the one or more antennas are positioned in the vicinity of a target component with the target computer system.

12. The method of claim 1, wherein multiple antennas are positioned in the vicinity of multiple target components within the target computer system.

13. The method of claim 1, wherein the one or more antennas used to collect the reference EMI signals are placed in substantially the same manner with respect to the reference computer system as the one or more antennas used to collect the reference EMI signals are placed with respect to the target computer system.

14. The method of claim 1, wherein each antenna can be a wire.

15. The method of claim 13, wherein the wire is a striped wire.

16. An apparatus that non-intrusively detects counterfeit components in a target computer system, comprising:
one or more antennas;
a collecting mechanism coupled to the one or more antennas, wherein the collecting mechanism is configured to collect reference electromagnetic interference (EMI) signals generated by a reference computer system using the one or more antennas positioned in close proximity to the reference computer system, wherein the reference EMI signals are generated by the reference computer system while a load script is executed by the reference computer system;
a generating mechanism configured to generate a reference EMI fingerprint for the reference computer system from the reference EMI signals;
wherein the collecting mechanism is further configured to collect target EMI signals generated by the target computer system using the one or more antennas positioned in close proximity to the target computer system, wherein the target EMI signals are generated by the target computer system while the load script is executed by the target computer system;
wherein the generating mechanism is further configured to generate a target EMI fingerprint for the target computer system from the target EMI signals; and
a comparison mechanism configured to compare the target EMI fingerprint to the reference EMI fingerprint to determine whether the target computer system contains a counterfeit component.

17. The apparatus of claim 16, wherein the one or more antennas are positioned outside of the chassis of the target computer system.

18. The apparatus of claim 16, wherein the one or more antennas are positioned inside the chassis of the target computer system.

19. The apparatus of claim 16, wherein the one or more antennas are positioned in the vicinity of a target component within the target computer system.

20. The apparatus of claim 16, wherein each antenna can be a wire.

21. A method for non-intrusively detecting counterfeit components in a target computer system, comprising:
collecting reference electromagnetic interference (EMI) signals generated by a target component within a reference computer system using one or more antennas positioned in close proximity to the target component, wherein the reference EMI signals are generated by the component while a load script is executed by the reference computer system;
generating a reference EMI fingerprint for the target component from the reference EMI signals;
collecting target EMI signals generated by the target component within the target computer system using one or more antennas positioned in close proximity to the target component, wherein the target EMI signals are generated by the target component while the load script is executed by the target computer system;
generating a target EMI fingerprint for the target component from the target EMI signals;
comparing the target EMI fingerprint to the reference EMI fingerprint; and
determining whether the target component within the target computer system is a counterfeit component based on the comparison result.

* * * * *